US008222153B2

(12) United States Patent
Lienhart et al.

(10) Patent No.: US 8,222,153 B2
(45) Date of Patent: Jul. 17, 2012

(54) TEXTURED SINGLE CRYSTAL

(75) Inventors: Fabien Lienhart, Paris (FR); Guillaume Lecamp, Paris (FR); François-Julien Vermersch, Paris (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 0 days.

(21) Appl. No.: 13/149,652

(22) Filed: May 31, 2011

(65) Prior Publication Data

US 2011/0294298 A1    Dec. 1, 2011

(30) Foreign Application Priority Data

May 31, 2010    (FR) ...................................... 10 54224

(51) Int. Cl.
*H01L 21/302*    (2006.01)
(52) U.S. Cl. ........ 438/703; 438/757; 438/705; 438/756; 216/44
(58) Field of Classification Search .................. None
See application file for complete search history.

(56) References Cited

U.S. PATENT DOCUMENTS

| 4,129,848 | A  | * | 12/1978 | Frank et al. | .................... | 338/308 |
| 2007/0246700 | A1 | * | 10/2007 | Park | ................. | 257/13 |
| 2010/0055397 | A1 | * | 3/2010 | Kurihara et al. | .............. | 428/141 |

FOREIGN PATENT DOCUMENTS

| CN | 101295636 A | 10/2008 |
| EP | 1670076 A2 | 6/2006 |

OTHER PUBLICATIONS

Optimization of front surface texturing processes for high-efficiency silicon solar cells E. Manea, E. Budianu, M. Purica, D. Cristea, I. Cernica, R. Muller, V. Moagar Poladian National Institute for Research and Development in Microtechnologies, Erou Iancu Nicolae str. 32B, PO Box 38-160, 72996 Bucharest, Romania.*
Application of Nanosphere Lithography to LED Surface Texturing and to the Fabrication of Nanorod LED Arrays Min-Yung Ke, Cheng-Yin Wang, Liang-Yi Chen, Hung-Hsien Chen, Hung-Li Chiang, Yun-Wei Cheng, Min-Yann Hsieh, Cheng-Pin Chen, and JianJang Huang, Senior Member, IEEE IEEE Journal of Selected Topics in Quantum Electronics, vol. 15, No. 4, July/A.*

(Continued)

*Primary Examiner* — Charles Garber
*Assistant Examiner* — Evren Seven
(74) *Attorney, Agent, or Firm* — Abel Law Group, LLP; Christian Colombier

(57) ABSTRACT

A method for fabricating a textured single crystal including depositing pads made of metal on a surface of a single crystal. A protective layer is deposited on the pads and on the single crystal between the pads; and etching the surface with a first compound that etches the metal more rapidly than the protective layer is carried out. Processing continues with etching the surface with a second compound that etches the single crystal more rapidly than the protective layer; and etching the surface with a third compound that etches the protective layer more rapidly than the single crystal. The textured substrate may be used for the epitaxial growth of GaN, AlN or III-N compounds (i.e. a nitride of a metal the positive ion of which carries a +3 positive charge) in the context of the fabrication of LEDs, electronic components or solar cells.

12 Claims, 3 Drawing Sheets

OTHER PUBLICATIONS

Figure 1:
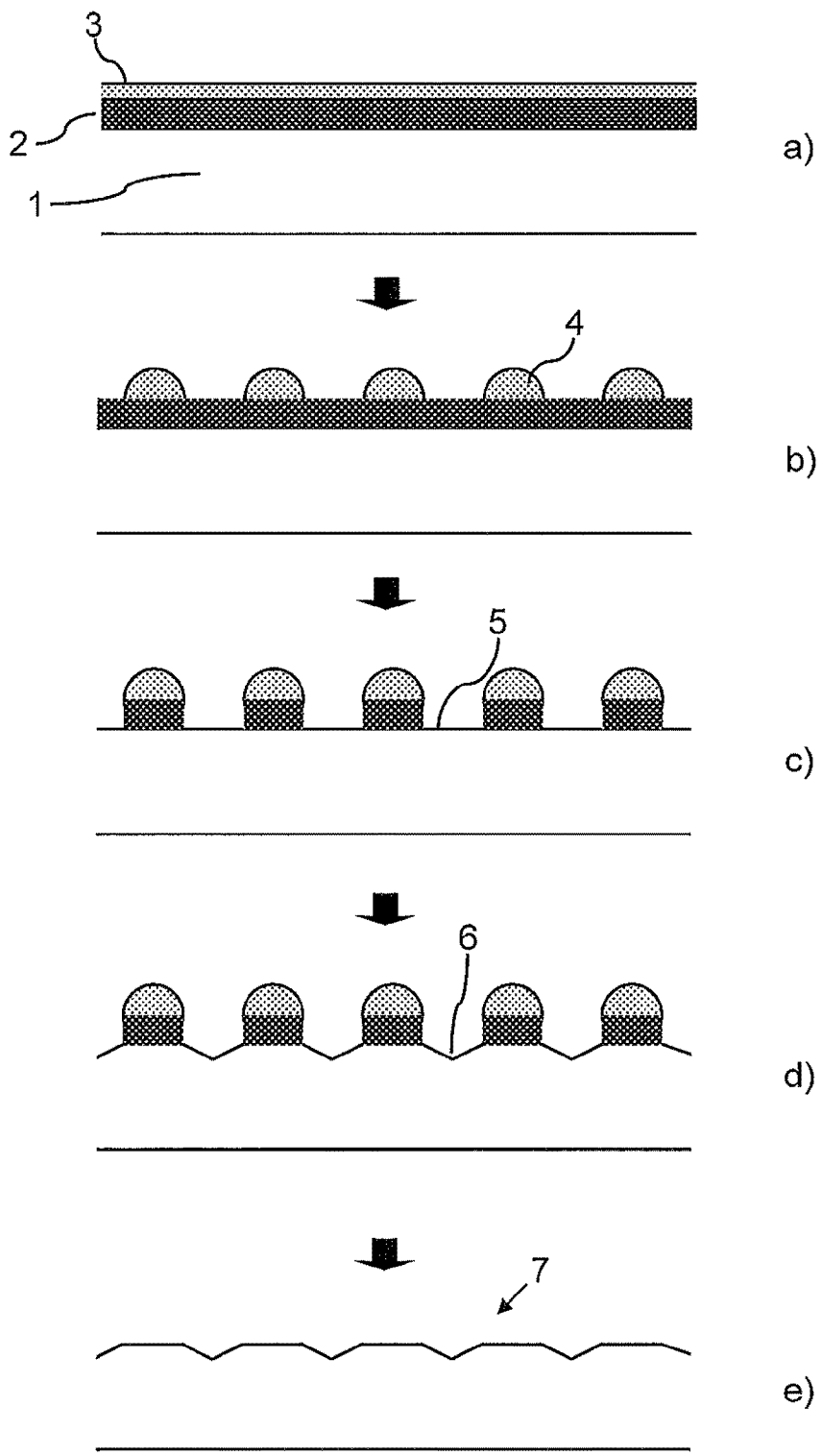

Z. Huang et al., XP002611518 & CN 101 660 187 A, Thomson Scientific, London, GB, Mar. 3, 2010, 2 pages.

French Search Report for Application No. 1054224, Dec. 6, 2010, 7 pages.

Haiyong Gao et al., "Enhancement of the Light Output Power of InGaN/GaN Light-Emitting Diodes Grown on Pyramidal Patterned Sapphire Substrates in the Micro-and Nanoscale," Journal of Applied Physics 103, 014314, (2008), 5 pages.

Takashi Mukai et al., "InGaN-Base Light-Emitting Diodes Grown on Epitaxially Laterally Overgrown GaN Substrates," Jpn. J. Appl. Phys. vol. 37 (1998), pp. L839-L841.

* cited by examiner

TEXTURED SINGLE CRYSTAL

CROSS-REFERENCE TO RELATED APPLICATION

The present application claims priority under 35 U.S.C. §119 to French Patent Application No. 1054224, filed May 31, 2010, which application is incorporated by reference herein in its entirety.

DETAILED DESCRIPTION

The invention relates to the field of textured single crystals used for the epitaxial growth of metal nitrides in the context of the fabrication of light-emitting diodes (LEDs).

To improve the performance of LEDs, especially those based on nitrides deposited on a single-crystal substrate such as sapphire, one technique consists in texturing the surface of the single crystal. This texture offers two advantages, it increases the light extracted and reduces the defect density in the GaN deposited on the substrate using a lateral growth technique. This texture may be irregular and structures having characteristic dimensions smaller than 5 µm, preferably lying between 100 nm and 1 µm, optimize LED performance. Nitrides that can be deposited on the substrate are: GaN, AlN, InN and mixtures of at least two of these compounds.

In order to produce a texture on sapphire, according to the prior art, particularly costly methods are employed involving producing a resist mask using photolithography followed by dry etching with a plasma.

The epitaxial lateral overgrowth (ELOG) process, for example of gallium nitride on sapphire, has especially been described in J. Appl. Phys. 37 (1998) pp. L839-L841. The sapphire is textured through an acidic chemical etch using an $H_3PO_4/H_2SO_4$ mixture producing cavities in the surface. The GaN is generally deposited by MOCVD.

CN 101295636 and J. Appl. Phys. 103 (2008) 014314 teach a method of preparing a textured layer of a material, for epitaxial growth of a nitride, comprising the following steps 1: depositing a thin metal layer on the material underlayer, 2: heat treating the thin metal layer so that it forms a textured metal mask, 3: transferring the texture of the metal into the material underlayer by etching and 4: removing the residual metal mask by wet etching.

US 2007/0246700 teaches production of textured sapphire using the following steps in succession: deposition of a silica layer on the sapphire; deposition of a metal on the silica; heat treatment making the metal form into droplets on the surface of the silica; reactive ion etching (RIE) or plasma etching to remove the silica between the metal droplets, forming metal-coated silica islands; etching with $H_3PO_4/H_2SO_4$ so as to texture the sapphire between the islands; and HF etching so as to remove the islands. This method is complex and involves RIE or plasma etching, which is costly and difficult to carry out.

According to an embodiment, a method for texturing a single crystal has now been discovered that is particularly simple to implement. The single crystal may for example be sapphire or silicon carbide or be made of gallium nitride.

According to an embodiment, a method for texturing a single crystal comprises:
  depositing pads made of metal on the surface of the single crystal;
  depositing a protective layer on the pads and on the single crystal between the pads;
  etching the surface with a first compound that etches the metal more rapidly than the protective layer;
  etching the surface with a second compound that etches the single crystal more rapidly than the protective layer; and
  etching the surface with a third compound that etches the protective layer more rapidly than the single crystal.

Surprisingly, although the protective layer covers both the metal pads and the single-crystal surface between the metal pads, it is observed that the chemical etch using the first compound dissolves the pads beneath the protective layer and that the second compound etches the single crystal in the locations where the pads used to be. The surface of the single crystal between the pads is not substantially etched. It is hypothesized that the first compound passes through pores (cracks, holes) in the protective layer, these pores being formed in the protective layer more easily when the latter is above the metal pads than when it is between the metal pads (directly on the single crystal). The interface between the protective layer and the metal is thus more fragile (poorer adhesion, larger differences in coefficients of thermal expansion) than the interface between the protective layer and the single crystal, thereby possibly explaining the poorer quality of the protective layer above the metal pads. Yet another explanation is that the metal pads have inclined or even near-vertical edge faces at their sides and the protective layer is probably much thinner and more porous on these edge faces. This fragility on the edge faces of the pads may promote etching by the first and second compound through the edge faces, the first and second compounds possibly then passing through the protective layer to where the pads are located. The term "compound", for the chemical etchants, is used in the widest possible sense of the word and it may be a composition comprising various substances.

After etching using the first compound the metallic pads have therefore disappeared, but the protective layer is still present adhering to the single crystal between the locations where the pads used to be and forming hollow, open pockets (empty of solids) in the locations where the pads used to be. There is a cavity under each of these pockets on the single crystal. The second compound etches the single crystal in the locations wherefrom the pads have disappeared. The etching step using the third compound removes the protective layer from the single crystal and frees the desired textured surface.

The metal pads may especially be made of Ag, Al, Au, Cr, Cu, In, Mo, Ni, Pt, Sn, Ti or W. Generally two steps are used to form them:
  a layer of the chosen metal is formed; and then
  a heat treatment is carried out at a temperature such that diffusion of the metal forms pads.

The metal layer may be formed by any suitable method, especially PVD, plasma deposition, evaporation, etc. In general, the metal layer has a thickness lying between 3 and 80 nm and preferably between 5 and 50 nm.

The heat treatment of the metal layer is carried out at a temperature such that the metal forms into pads (or droplets) under the effect of diffusion and the surface tensions present. In general, it is not absolutely necessary to raise the temperature higher than the melting point of the metal considered. It may even be enough to raise the temperature to far below the melting point of the metal. Routine testing easily allows the minimum temperature at which these pads form to be found. If $T_f$ is the (theoretical) melting point of the metal, it is possible for example to raise the temperature to $T_f$—650° C. or more. The range from $T_f$—750° C. to $T_f$ is generally satisfactory. Depending on the metal chosen and its tendency to oxidize, it may possibly be preferable to carry out the heat treatment under an inert atmosphere (for example argon).

Thus embodiments also relate to a method used to produce metal pads: deposition of a layer of the metal followed by a heat treatment at a temperature such that diffusion of the metal leads to the pads being formed.

Producing the pads in a single step, with deposition of the metal being carried out at a high enough temperature that the metal forms into pads, is not ruled out. The pads are then formed in-situ during the deposition of the metal.

The protective layer is generally a layer made of a silicon-IV compound such as silicon oxide or silicon nitride or an oxynitride of silicon. This layer may generally be deposited by CVD or PECVD or even by PVD (sputtering, pulsed laser deposition (called PLD), etc.). The deposition may be a high-temperature deposition. This deposited layer may have a thickness between 1 and 350 nm.

After the protective layer has been deposited, chemical etching is carried out using a first compound that etches the metal more rapidly than the protective layer. Preferably, this first compound does not etch the protective layer. This first compound may for example be an aqueous solution of nitric acid, especially concentrated nitric acid (to 68 wt %). This nitric-acid etch may for example be carried out between 15° C. and 50° C. This may also be an aqueous solution of sulphuric acid and phosphoric acid. Such a solution may for example be obtained by mixing a 50-98 wt % sulphuric acid in water solution with a 50-85 wt % phosphoric acid in water solution, the volume ratio between these two solutions possibly varying from 10:1 to 1:10. Preferably, the volume ratio of $H_2SO_4:H_3PO_4$ varies from 2:1 to 4:1. This etching by a mixture of sulphuric acid and phosphoric acid may be carried out between 170° C. and the boiling point of the solution, the latter generally being lower than 280° C.

After the metal has been etched, the single crystal is etched by a second compound that etches the single crystal more rapidly than the protective layer. Preferably, this second compound does not etch the protective layer. The compound chosen depends on the nature of the single crystal. A compound suited to the etching of SiC is the Murakami solution, an aqueous solution of caustic soda and potassium ferricyanide ($K_3Fe(CN)_6$). This etching, using the Murakami solution, may be carried out at boiling point. A compound suited to the etching of sapphire or GaN is an aqueous solution of sulphuric acid and phosphoric acid. The characteristics of and preferences for this solution are the same as those given above for the metal etch.

The first and second compounds can be identical. This makes it possible to etch the metal and the single crystal simultaneously using the same preparation without needing to worry about when the etching of the metal ends and when the etching of the single crystal begins. This is possible only if the compound chosen etches both the metal and the single crystal more rapidly than the protective layer. For the case where the single crystal is sapphire or GaN, such a dual-function compound is an aqueous solution of sulphuric acid and phosphoric acid. The characteristics of and preferences for this solution are the same as those given above for the metal etch.

After this etching with the first, then the second compound (the two possibly being identical), a chemical etch using a third compound is carried out, this third compound etching the protective layer more rapidly than the single crystal. Here the aim is simply to remove the protective layer by dissolving it. Hydrofluoric acid is ideally suited to this etching. For example, an aqueous solution containing 1% HF may be used for 30 minutes at room temperature.

Before various layers are deposited on the substrate it is cleaned, for example using ethanol or a piranha solution (a mixture of sulphuric acid and hydrogen peroxide) or using a heat treatment, etc.

In general, a deionized-water rinse is carried out between the etches using the various compounds.

Embodiments of invention are particularly economical in that they only involve depositing layers, possibly by magnetron sputtering or by evaporation, and wet etching steps.

It is possible to control the diameter of the cavities of the texture from 50 nm to 10 microns, simply by controlling the thickness of the metal deposited. This is because, the diameter of the cavities substantially corresponds to that of the metal pads. The expression "diameter of a cavity" is understood to mean the smallest circle that is able to contain the entire perimeter of the cavity at the surface of the single crystal. Thus, by way of example, depositing a layer of 10 nm of silver leads to features having a characteristic size of 100 nm being obtained whereas depositing a layer of 80 nm of silver leads to the features being 2 μm in size. Generally a metal layer smaller than 40 nm in thickness is deposited, which results in 90% of the cavities having a diameter smaller than 1 μm. Generally a metal layer is deposited having a thickness such that 90% of the cavities have a diameter larger than 100 nm. Generally a metal layer is deposited having a thickness larger than 7 nm. Of course, if the etching of the single crystal by the third compound is allowed to continue for too long the diameter of the cavities will increase beyond that of the metal pads and pass beneath the protective layer. This being so, the thickness of the metal film still remains the main parameter for defining the size of the cavities. A person skilled in the art will easily be able to optimize the conditions of the etch using the third compound in order to find the optimum etch time that leads to cavity diameters substantially equal to those of the metal pads.

The textured substrate according to the invention may be used for the epitaxial growth of GaN, AlN or III-N compounds (i.e. a nitride of a metal the positive ion of which carries a +3 positive charge) in the context of the fabrication of LEDs, electronic components or solar cells. The texture of the single crystal obtained according to the invention may be used to obtain an antireflection effect via an average refractive index effect: the cavities obtained on the surface, if they are small relative to the incident wavelength, modify the refractive index seen by this wave. This effect makes it possible to reduce the average refractive index of the surface and to improve the refractive index match between the substrate and the epitaxial layers in the infrared or the visible. Furthermore, the texture obtained causes lateral overgrowth of the epitaxial compound (ELOG) improving the quality of the epitaxial crystal and reducing the number of dislocations and therefore improving the final product. Other applications of the antireflection effect of the invention are possible, especially in military (sapphire windows) or aerospace fields.

FIG. 1 shows a prior-art method for giving sapphire a texture. A silica layer 2 then a metal layer 3 have been deposited in succession on a sapphire substrate 1 (FIG. 1a). Using a heat treatment, the metal of the layer 3 is formed into pads 4 under the effect of diffusion and the surface tensions present (FIG. 1b). An RIE etch then removes the silica between the pads 4 exposing the surface of the sapphire in locations 5 (FIG. 1c). Next, etching with an $H_3PO_4/H_2SO_4$ solution creates texture cavities 6 in the sapphire in the locations 5 made accessible (FIG. 1d). An HF etch then clears the sapphire of the silica and metal residual layers, and a textured sapphire surface 7 is obtained (FIG. 1e).

Figure 2:
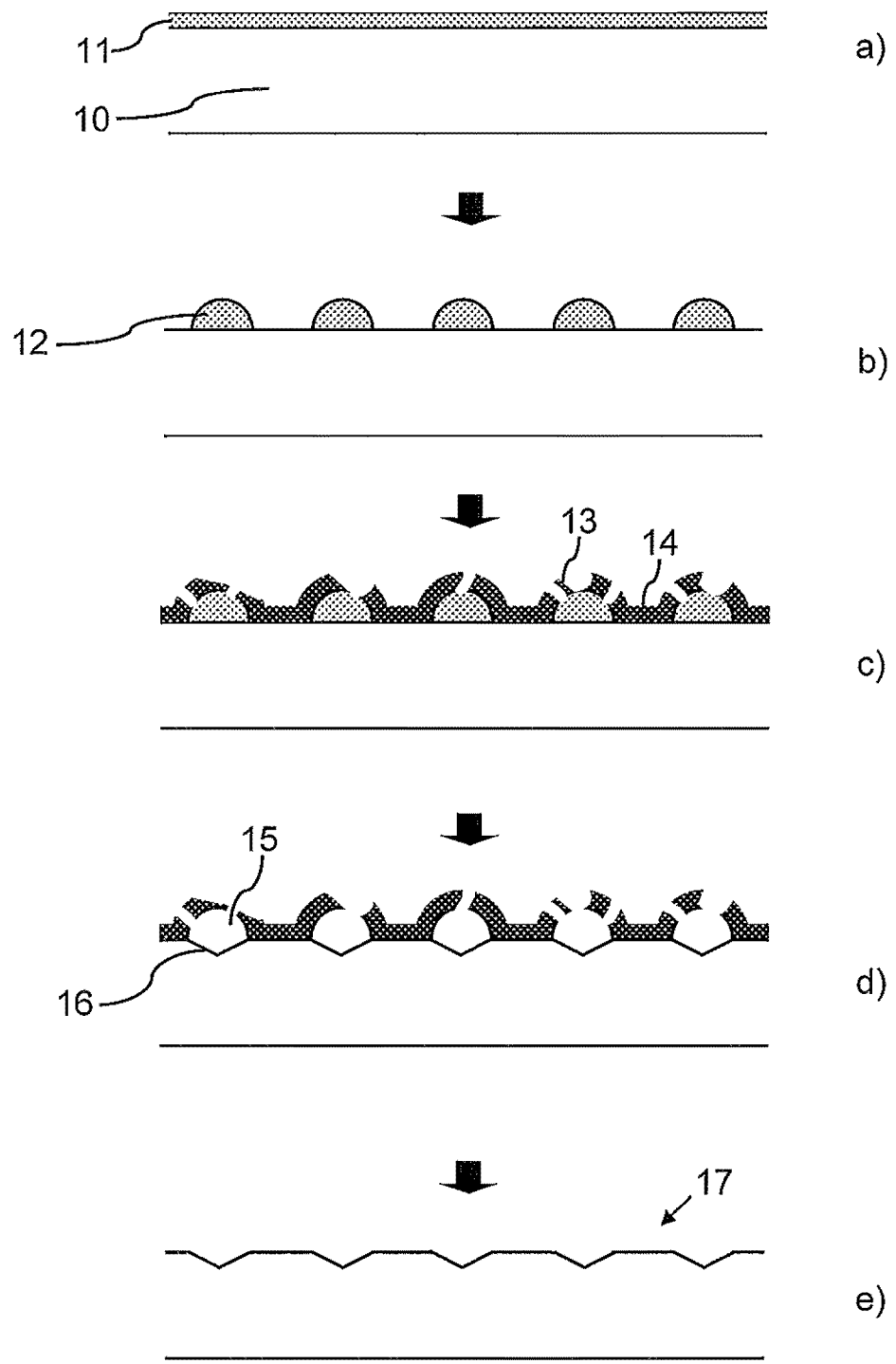

FIG. 2 shows the method for giving a single crystal a texture, according to the invention. A metal layer 11 has been deposited on a single crystal 10 (FIG. 2a). Using a heat treatment, the metal of the layer 11 is formed into pads 12 under the effect of diffusion and the surface tensions present (FIG. 2b). Next a silica protective layer is deposited, which layer is much more porous (cracks, holes, smaller thickness) and less adherent to the surface 13 of the pads than to the surface 14 of the single crystal between the pads (FIG. 2c). Etching with the first compound then the second compound can occur through the pores 13 in the protective layer and rapidly dissolves the metal pads then etches the surface of the single crystal in order to form cavities 16 (FIG. 2d). The volumes corresponding to the metal pads have become empty cavities 15. An HF etch clears the single crystal of the silica and the textured single crystal 17 desired is thus obtained (FIG. 2e).

Figure 3:
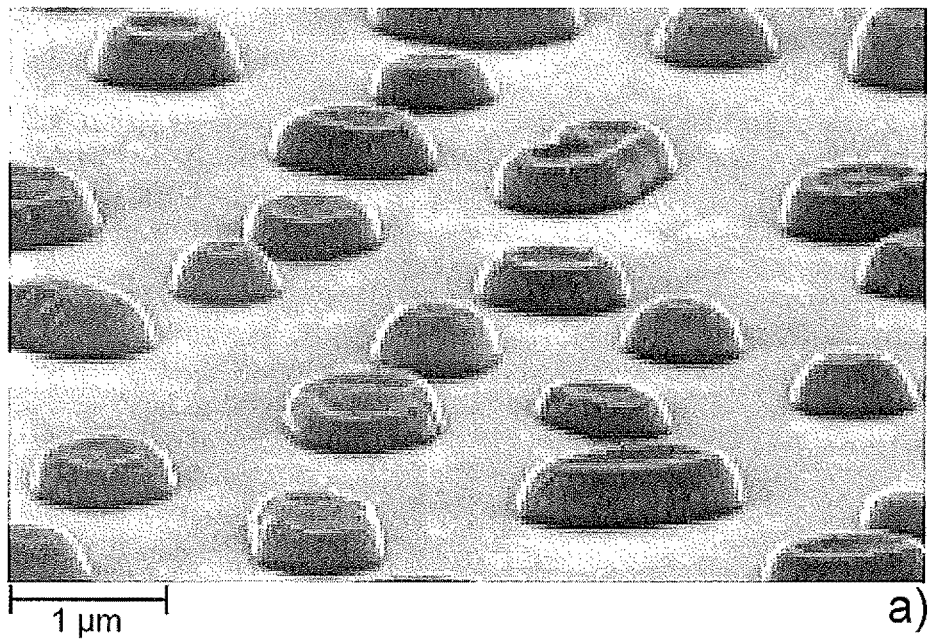
Figure 3:
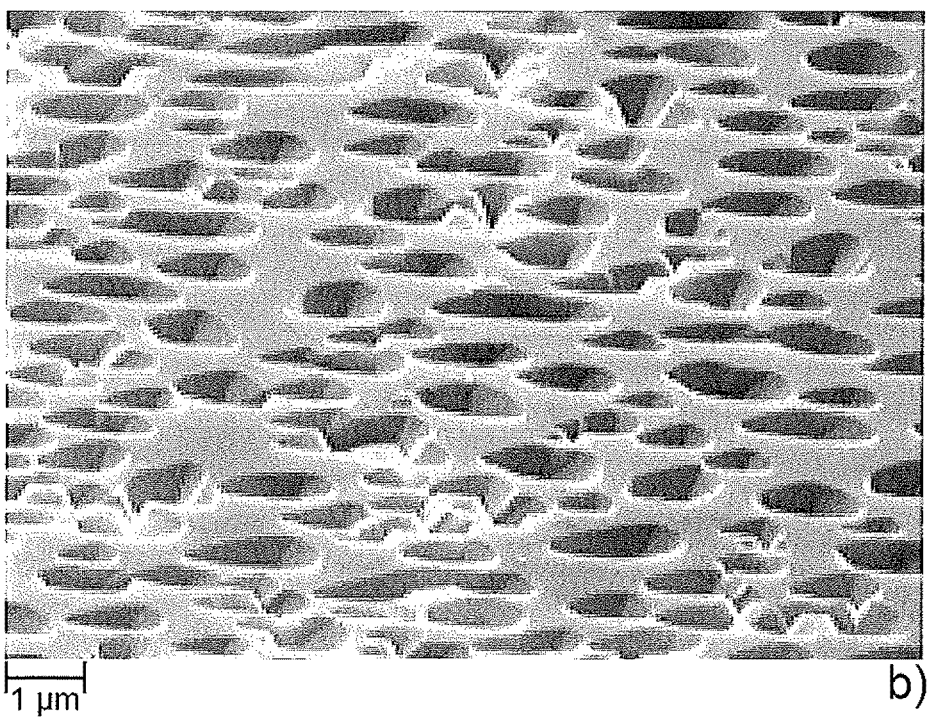

FIG. 3a shows silver pads on the surface of a sapphire substrate observed using a scanning electron microscope. FIG. 3b shows cavities created using the method according to the invention in the surface of a sapphire substrate, observed using a scanning electron microscope.

EXAMPLE

A layer of 40 nm of silver was deposited, by magnetron sputtering, on a sapphire substrate at room temperature, at a pressure of 8 μbar and a power of 500 W, for 2 minutes under argon. The substrate coated with silver was heated for 45 minutes at 300° C. in the open air leading to pads (or droplets) of silver being formed as shown in the scanning electron microscope photo of FIG. 3a. A film of 20 nm of silica was then deposited by magnetron sputtering (at room temperature, under a pressure of 2 μbar, at a power of 3 kW, under a mixture of argon and oxygen, for a little under 2 minutes) covering both the sapphire and the silver formed into pads. The substrate thus coated was then immersed in an aqueous solution, containing 3:1 parts of $H_2SO_4$:$H_3PO_4$ and 7.5 wt % water, brought to boiling point for 55 minutes, reaching a temperature plateau of 240° C. It was then observed that the silver had been etched through the silica layer and that the sapphire beneath the silver had also been etched. Finally, the sample was etched using a solution of 1% HF at room temperature for 30 minutes removing the silica from the substrate. Thus a nano-textured sapphire substrate was obtained as the scanning electron microscope photo of FIG. 3b shows.

The invention claimed is:

1. Method for fabricating a textured single crystal comprising:
    depositing pads comprising metal on a surface of a single crystal;
    depositing a protective layer on the pads and on the single crystal between the pads;
    etching the surface with a first compound that etches the metal more rapidly than the protective layer;
    etching the surface with a second compound that etches the single crystal more rapidly than the protective layer; and
    etching the surface with a third compound that etches the protective layer more rapidly than the single crystal.

2. Method according to claim 1, characterized in that the metal is chosen from Ag, Al, Au, Cr, Cu, In, Mo, Ni, Pt, Sn, Ti, W.

3. Method according to claim 1, characterized in that the pads are produced by depositing a metal layer followed by a heat treatment at a temperature such that diffusion of the metal layer leads to the pads being formed.

4. Method according to claim 3, characterized in that the metal layer has a thickness larger than 7 nm.

5. Method according to claim 1, characterized in that the metal layer has a thickness smaller than 40 nm.

6. Method according to claim 1, characterized in that the heat treatment is carried out at a temperature higher than $T_f$—650° C., especially $T_f$—750° C., $T_f$ being the melting point of the metal.

7. Method according to claim 1, characterized in that the single crystal is sapphire.

8. Method according claim 7, characterized in that the first compound and the second compound comprise a solution of sulphuric acid and phosphoric acid.

9. Method according to claim 1, characterized in that the first compound and the second compound are identical.

10. Method according to claim 1, characterized in that the protective layer is a silicon-IV compound such as silicon oxide or silicon nitride or an oxynitride of silicon.

11. Method according to claim 1, characterized in that the thickness of the protective layer lies between 1 and 350 nm.

12. Method according to claim 1, characterized in that the third compound comprises hydrofluoric acid.

* * * * *

UNITED STATES PATENT AND TRADEMARK OFFICE
CERTIFICATE OF CORRECTION

| | | |
|---|---|---|
| PATENT NO. | : 8,222,153 B2 | Page 1 of 1 |
| APPLICATION NO. | : 13/149652 | |
| DATED | : July 17, 2012 | |
| INVENTOR(S) | : Fabien Lienhart et al. | |

It is certified that error appears in the above-identified patent and that said Letters Patent is hereby corrected as shown below:

On the Title Page
Item (74), please delete "Christian Colombier."

Signed and Sealed this
Twentieth Day of May, 2014

Michelle K. Lee
*Deputy Director of the United States Patent and Trademark Office*